(12) United States Patent
Chung et al.

(10) Patent No.: US 7,084,950 B2
(45) Date of Patent: Aug. 1, 2006

(54) CHROMELESS PHOTOMASK AND EXPOSURE APPARATUS INCLUDING THE CHROMELESS PHOTOMASK

(75) Inventors: Dong-Hoon Chung, Yongin (KR); Jin-Hyung Park, Seongnam (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 115 days.

(21) Appl. No.: 10/407,462

(22) Filed: Apr. 7, 2003

(65) Prior Publication Data
US 2004/0048168 A1 Mar. 11, 2004

(30) Foreign Application Priority Data
Sep. 6, 2002 (KR) .................. 10-2002-0053923

(51) Int. Cl.
*G03B 27/32* (2006.01)
*G03B 27/42* (2006.01)
*G03F 1/00* (2006.01)

(52) U.S. Cl. ............................. 355/18; 355/53; 430/5

(58) Field of Classification Search ............ 430/5, 430/22; 355/18, 52, 53, 67
See application file for complete search history.

(56) References Cited

U.S. PATENT DOCUMENTS

2004/0063000 A1* 4/2004 Maurer et al. ............. 430/5
2004/0197674 A1* 10/2004 Bailey et al. .............. 430/5

FOREIGN PATENT DOCUMENTS

KR 2002-0058287 7/2002
WO WO 01/63864 A2 8/2001

* cited by examiner

*Primary Examiner*—S. Rosasco
*Assistant Examiner*—John Ruggles
(74) *Attorney, Agent, or Firm*—Volentine Francos & Whitt, PLLC (57) ABSTRACT

A chromeless photomask includes a main pattern portion and a complementary pattern portion formed in the surface of the transparent mask substrate adjacent to an outer peripheral edge of the main pattern portion. The main and complementary pattern portions are each formed by recessing a surface of a transparent mask substrate to produce respective protrusions and recesses that induce a phase difference of 180 degrees in light rays passing therethrough. The complementary pattern portion is designed to produce interference that prevents distortion in the photoresist pattern formed at a region by and corresponding to the edge of the main pattern portion of the photomask. Accordingly, the present invention provides for a relatively large secondary mask alignment margin.

9 Claims, 9 Drawing Sheets

CHROMELESS PHOTOMASK AND EXPOSURE APPARATUS INCLUDING THE CHROMELESS PHOTOMASK

BACKGROUND OF THE INVENTION

1. Field of the Invention

The present invention relates to photolithographic equipment and, in particular, an exposure apparatus, for use in forming a pattern on a semiconductor substrate. More specifically, the present invention relates to a chromeless photomask and to a method of manufacturing the same.

2. Description of the Related Art

In general, photomasks for use in photolithography are constructed of a transparent mask substrate formed of quartz, for example, and an opaque, metallic light-blocker layer formed of a desired pattern of chromium on the transparent mask substrate. The chromium light-blocker layer shields the exposure light, and causes light passing through the transparent substrate to undergo diffraction and interference, such that a corresponding micro-pattern can be transferred to a photoresist deposited on a semiconductor substrate. Nowadays, though, the density of semiconductor devices is at a very high level as exemplified by 256 or greater MDRAMs. Also, the line widths of the devices are as small as 0.25 μm or less. The photomasks comprising chromium light-blocker layers and that rely on the phenomena of diffraction or interference to transfer a micro-pattern to a semiconductor substrate are limited in their ability to form narrow and accurate micro-patterns. Phase shift masks and chromeless photomasks have been developed as viable alternatives to address these limitations. The phase shift masks or chromeless photomasks use a transparent pattern formed on or in a transparent mask substrate to create a phase difference that produces a photoresist pattern.

A chromeless photomask transmits 100% of light through both a recessed area and a non-recessed area. However, the light passing through the recessed area is out of phase by 180 degrees from the light passing through the non-recessed area. As a result, the light rays passing through the recessed and non-recessed areas produce interference by which a predetermined pattern can be formed on a photoresist deposited on a semiconductor substrate. As long as the photomask pattern is well-designed, a chromeless photomask can be used to create a much finer pattern on a substrate than can be created using a conventional photomask having a chromium light-blocker layer.

Figure 12:
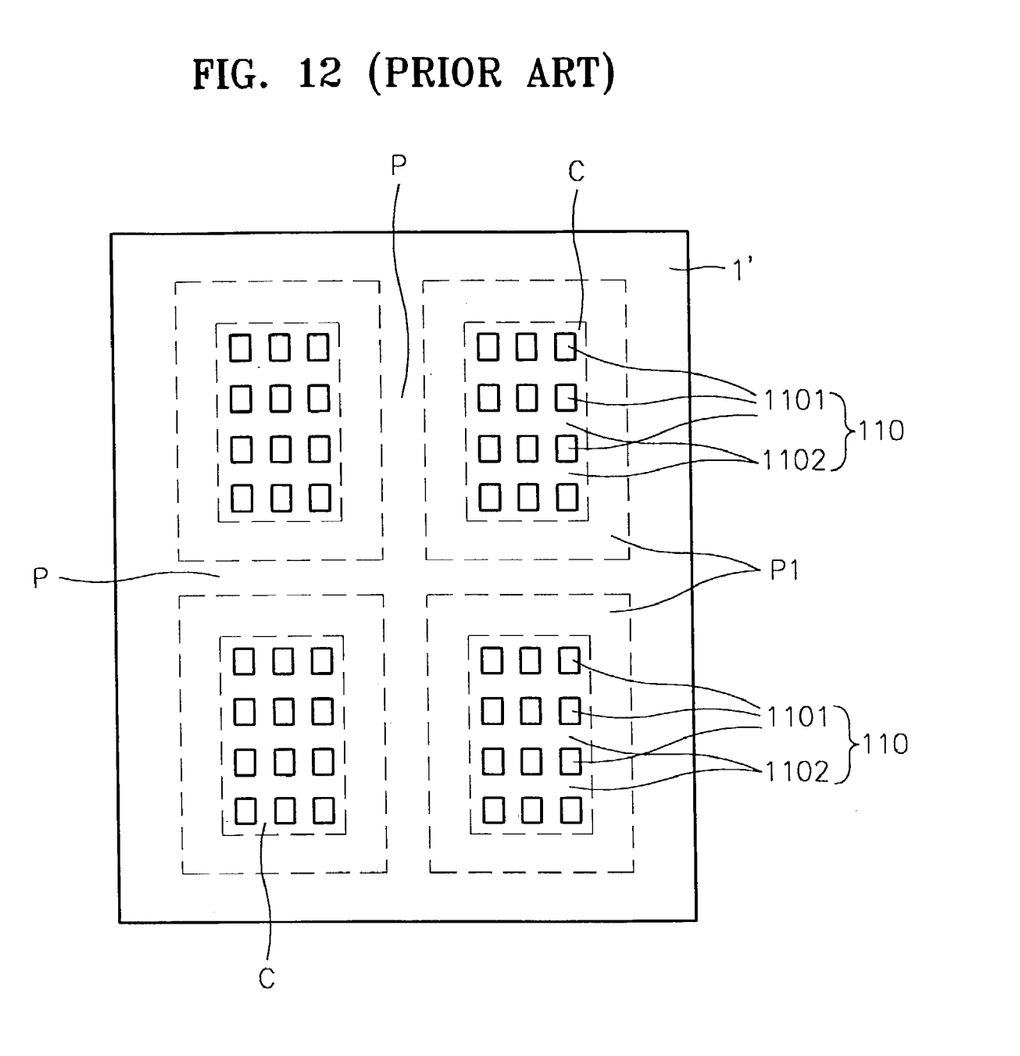
FIG. 12 is a plan view of a conventional chromeless photomask.

An example of a conventional chromeless photomask is shown in FIG. 12. Referring to FIG. 12, a conventional chromeless photomask 1' includes a core area C including a main pattern 110 of closely spaced areas and a peripheral area P surrounding the core area C as separated a predetermined distance therefrom. The chromeless photomask consists of raised and recessed portions used to create an interference pattern by which a corresponding photoresist pattern can be formed on a semiconductor substrate.

More specifically, the main pattern 110 in the core area C includes a plurality of identical areas which are closely spaced to produce interference when light passes through the core area C, whereby an image corresponding to the main pattern 110 can be effectively transferred to a photoresist. However, neighboring peripheral area P1 surrounding the main pattern 110 may cause problems in the forming of the photoresist pattern. In particular, the outer areas of the main pattern 110 are affected by the neighboring peripheral areas P1 such that an insufficient interference of light occurs at these areas leading, in turn, to a distorted photoresist pattern.

In addition, when the photomask 1' is misaligned along an X-axis, for example, during the exposure process, an undesirable "bar" appears along an area of the photoresist corresponding to one edge of the main pattern 110, and a great amount of pattern distortion occurs along an area corresponding to the opposite edge of the main pattern 110. Moreover, the forming of a photoresist pattern using a conventional chromeless photomask is vulnerable to the problem of lens flare.

SUMMARY OF THE INVENTION

Accordingly, an object of the present invention is to provide a photomask capable of forming a photoresist pattern without edge distortion and wherein an increased alignment margin is attained with respect to a secondary aspect of the mask alignment procedure.

According to one aspect of the present invention, the photomask comprises a light-transmitting mask substrate, and a light-transmitting main pattern portion and a light-transmitting complementary pattern portion each formed by raised and recessed portions of material that will induce a phase difference of 180 degrees in light rays passing therethrough. The complementary pattern portion is formed adjacent the outer peripheral edge of the main pattern portion. The raised and recessed portions of the main pattern portion constitute a first pattern dedicated to produce the interference that forms the desired pattern on a photoresist layer. The raised and recessed portions of the complementary pattern portion constitute a second pattern that will produce interference that will enhance the portion of the desired pattern formed on the photoresist layer by light passing through the outer peripheral edge of the main pattern portion.

Preferably, the mask substrate is formed of a 100% light-transmitting (exposure light) material, for example, quartz. The form of the second pattern defined by the complementary pattern portion may be simpler than that defined by the main pattern portion. Preferably, this second pattern is a pattern of identical stripes spaced a predetermined distance from one another and aligned along the outer peripheral edge of the main pattern portion. Thus, the interference between light rays passing through the complementary raised and recessed portions is such that a corresponding portion of a photoresist layer below the complementary pattern portion is maximally shielded from or is minimally exposed to the exposure light. Either of these effects will enhance that portion of the photoresist pattern formed at a region by and corresponding to the outer edge of the main pattern portion of the photomask.

In an exposure apparatus, such as a stepper, of photolithographic equipment, the photomask is supported between a light source and a projection lens of the apparatus. Preferably, the pitch of the complementary raised portion and the complementary recessed portion of the photomask is constant such that a regular interference pattern is produced by light rays passing therethrough. The pitch of the stripes formed by the complementary raised portion and the complementary recessed portion is designed based on the wavelength λ of the light emitted by the light source of the exposure apparatus, and the diffraction angle θ of the light passing through the transparent mask substrate. Preferably, the pitch is equal to or smaller than $0.61*(\lambda/\sin\theta)$.

According to yet another aspect of the present invention, a method of manufacturing a chromeless photomask having the structure described above includes providing a mask substrate having a light-blocker mask layer on a surface thereof, removing select portions of the mask layer to form a main mask pattern and a complementary mask pattern, subsequently etching the mask substrate to a predetermined depth using the light-blocker mask layer as an etch mask to form a main pattern and a complementary pattern in the mask substrate, wherein each of the main pattern and the complementary pattern in the mask substrate will induce a phase difference of 180 degrees in light rays passing therethrough, and subsequently removing the light-blocker mask layer from the mask substrate.

The light-blocker mask layer is preferably a chromium layer. In this case, the selected portions of the light-blocker layer may be removed using an e-beam lithographer so that fine and accurate main and complementary mask patterns can be formed.

On the other hand, the mask substrate may be etched by plasma dry etching, and preferably, using a CF-based reactant gas. The use of the CF-based reactant gas in plasma dry etching facilitates the etching of the mask substrate especially when it is made of quartz, and enables the entire surface of the mask substrate to be etched uniformly.

After the substrate is etched, the main and complementary mask patterns of the light-blocker mask layer may be etched away, and the surface of the substrate may then be subjected to a wet cleaning process. Preferably, the light-blocker mask layer is removed from the mask substrate by wet etching using a metal etchant. Suitable metal etchants for this wet etching include solutions of sulfuric acid ($H_2SO_4$), hydrogen chloride (HCl), nitric acid ($HNO_3$), acetic acid ($CH_3COOH$), and mixtures of these acid solutions. The use of the metal etchant is preferred because it can readily etch the metallic light-block mask layer without damaging the mask substrate. Alternatively, the light-blocker mask layer may be removed using dry etching.

A photoresist pattern free of edge distortion can be formed by photolithography using the chromeless photomask according to the present invention because the chromeless complementary pattern portion is formed adjacent to and along the edge of the chromeless main pattern portion of the photomask. Such pattern distortion in the edge of the photoresist pattern can be prevented even when a slight misalignment occurs in a secondary mask alignment process. In addition, the possibility of flare due to a defect in the lens of the stepper can be reduced.

BRIEF DESCRIPTION OF THE DRAWINGS

The above and other objects, features and advantages of the present invention will become more apparent from the following detailed description of the prefewed embodiments thereof made with reference to the attached drawings, in which.

DETAILED DESCRIPTION OF THE PREFERRED EMBODIMENTS

The preferred embodiments of the present invention will now be described in detail with reference to the accompanying drawings.

Figure 1:
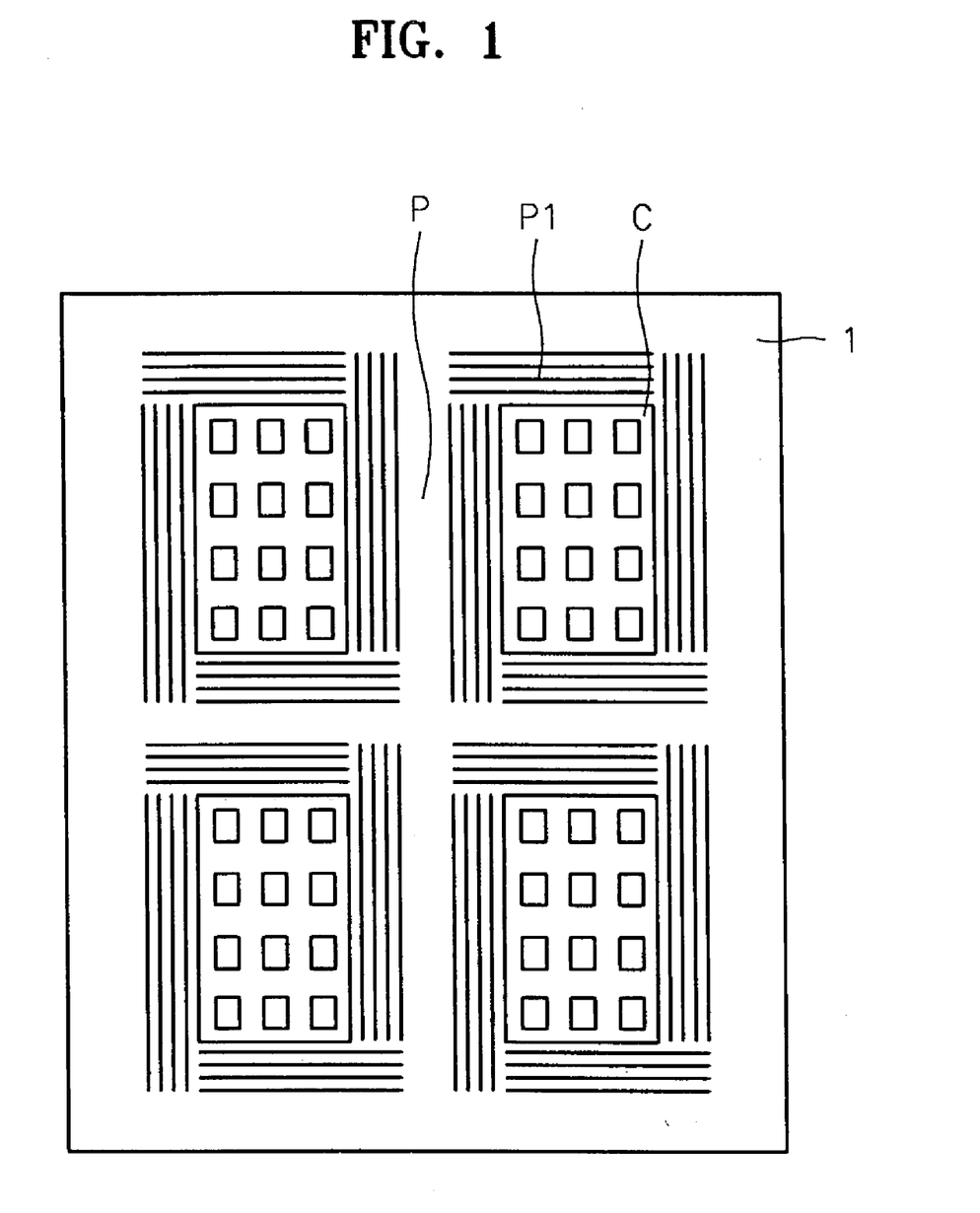
FIG. 1 is a plan view of a chromeless photomask according to the present invention.
Figure 2:
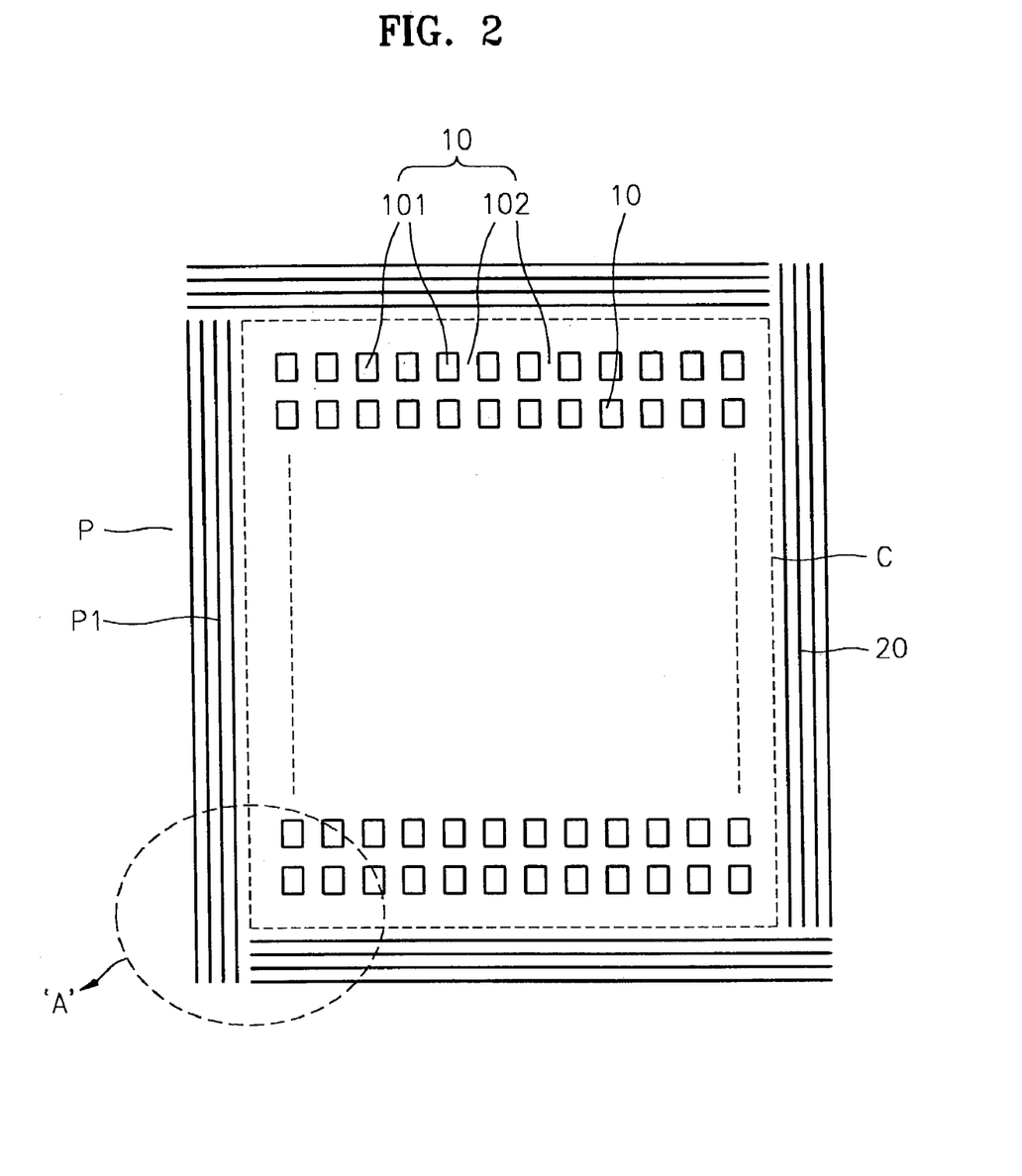
FIG. 2 is an enlarged plan view of a pattern unit of the chromeless photomask according to the present invention

Referring first to FIGS. 1 and 2, a chromeless photomask according to the present invention includes a transparent mask substrate 1 having a core area C and a peripheral area P. The mask substrate 1 is formed of a light-transmitting material, and preferably of a transparent material such as quartz. The core area C of the mask substrate 1 defines a main pattern portion 10, which is used to pattern a photoresist on a semiconductor substrate. A portion P1 of the peripheral area P of the mask substrate directly adjacent the core area C defines a complementary pattern portion 20.

Figure 3:
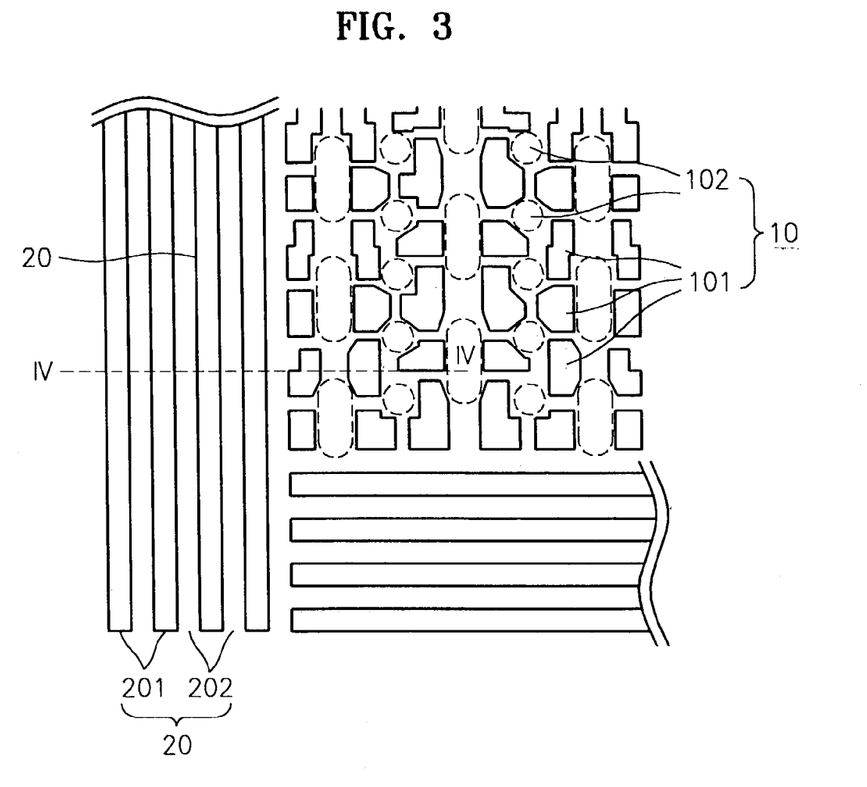
FIG. 3 is an enlarged plan view of portion A in FIG. 2.
Figure 4:
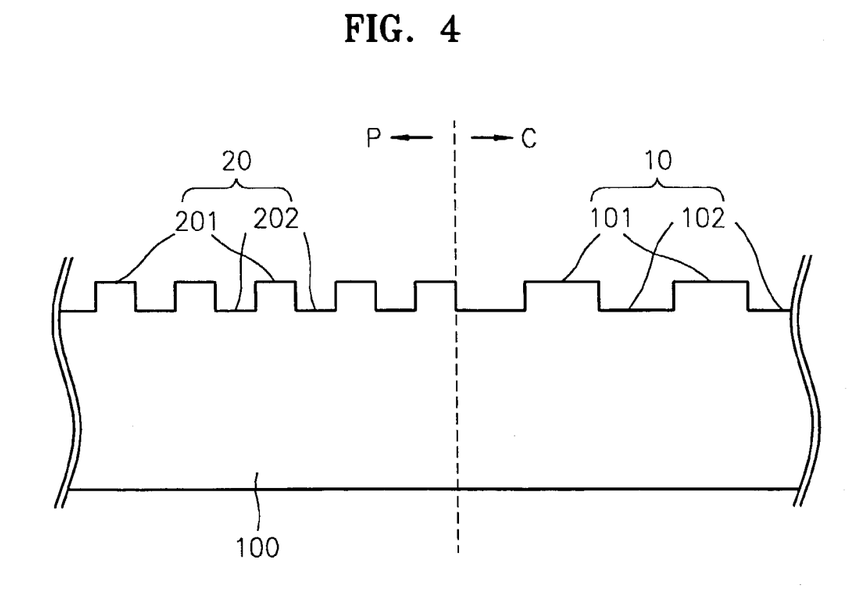
FIG. 4 is a sectional view taken along line IV—IV in FIG. 3.

Referring to FIGS. 3 and 4, the main pattern portion 10 is made by forming recesses to a predetermined depth in the surface of the mask substrate 1, resulting in a main raised portion 101 and a main recessed portion 102. Both the main raised portion 101 and the main recessed portion 102 transmit light because the main raised and recessed portions 101 and 102 are of transparent material, namely quartz. The difference in height between the main raised and recessed portions 101 and 102 is designed to induce a 180-degree phase difference between light rays passing through the main raised and recessed portions 101 and 102 and, in turn, to cause the wavefronts of the light rays propagating from the main raised and recessed portions 101 and 102 to undergo interference at the photoresist on the semiconductor substrate. Thus, the interference pattern will result in the image of a micro-pattern being formed on the photoresist, which micro-pattern has a CD or line width that is narrower than that of the main pattern portion 10.

The complementary pattern portion 20 has a second pattern that is different from the first pattern defined by the main pattern portion 10, e.g., is simpler than the first pattern. In particular, the complementary pattern portion 20 is a pattern of stripes made by forming grooves to a predetermined depth in the surface of the mask substrate 1, resulting in a plurality of alternating complementary raised and recessed portions 201 and 202. The pitch of the complementary raised and recessed portions 201 and 202 is constant so that light rays passing through the complementary raised and recessed portions 201 and 202 of the mask substrate 1 undergo interference on the photoresist that enhances the interference pattern otherwise produced by the edges of the main pattern portion 10 adjacent the peripheral area P. Accordingly, a sharp photoresist pattern free of distortion and having a uniform critical dimension can be produced.

The pitch of the complementary raised and recessed portions 201 and 202 is designed for based on the wavelength $\lambda$ of the exposure light produced by the photo stepper of the photolithography equipment that employs the photomask, and the angle of diffraction $\theta$ of light passing through the complementary pattern portion 20. Moreover, the shorter the wavelength, the easier it is to form a fine pattern. However, as the wavelength of the light and the design rule of the pattern become smaller, the angle of diffraction becomes greater. One might, therefore, think to reduce the distance between the photomask and a lens of the photo stepper. In general, though, the distance between the lens and the photomask is fixed in the photo stepper. Therefore, the inventors have conducted experiments to optimize the pitch of the complementary raised and recessed portions 201 and 202 with the aim of providing a photomask that can form the finest non-distorted pattern. Through these experiments, a pitch equal to or less than $0.61*(\lambda/\sin \theta)$ was determined to be most appropriate for forming a fine, accurate photoresist pattern using the phase shifting effect produced by a photomask according to the present invention.

Figure 5:
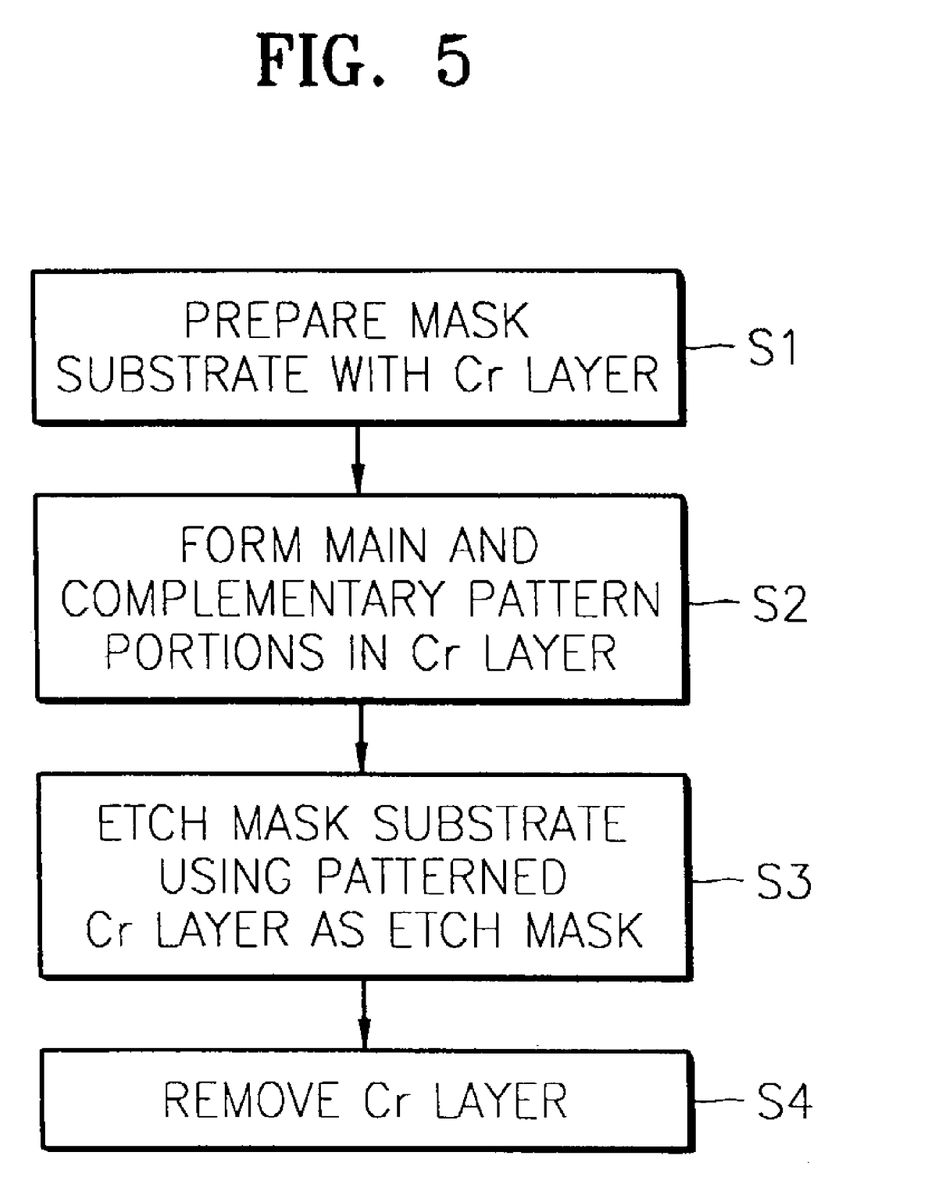
FIG. 5 is a flowchart of an embodiment of a method of manufacturing a chromeless photomask according to the present invention.

FIG. 5 is a flowchart of a method of manufacturing a chromeless photomask according to an embodiment of the present invention. FIGS. 6 through 10 illustrate the steps in the flowchart of FIG. 5.

Figure 6:
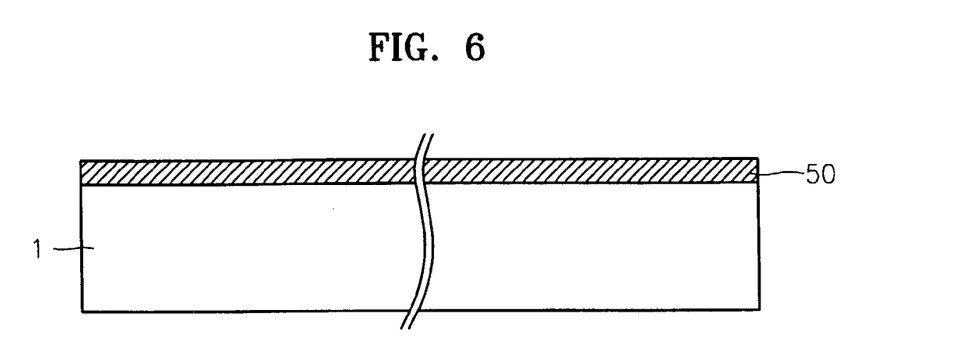
FIGS. 6 through 10 are sectional views each illustrating a respective step of the method a of manufacturing the chromeless photomask according to the present invention.

Referring to FIG. 6, a mask substrate 1 having a light-blocker mask layer 50 on a surface thereof is prepared (step S1 in FIG. 5). The mask substrate 1 is a flat rectangular plate formed of transparent quartz. The light-blocker mask layer 50 is formed of chromium so as to be 100% light-shielding (opaque) with respect to the exposure light (the light-blocker mask layer 50 will be hereinafter referred to as the Cr layer 50). The Cr layer 50 may be formed using a physical vapor deposition process, for example, a metal evaporating or metal sputtering process. Alternatively, the Cr layer 50 may be formed using an electrochemical method, for example, an electrolysis plating method.

As described above, the mask substrate 1 with the Cr layer 50 can be manufactured by forming the Cr layer 50 on a bare mask substrate. Alternatively, the mask substrate 1 with the Cr 50 may be purchased ahead of time.

Figure 7:
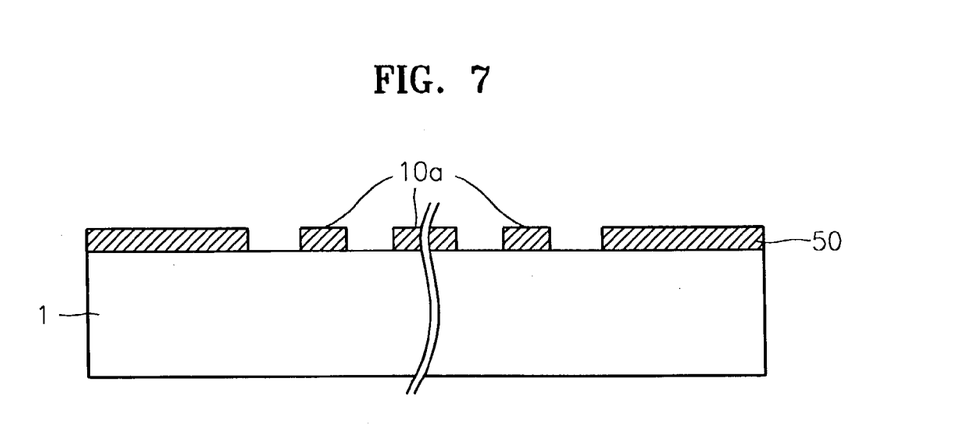
Figure 8:
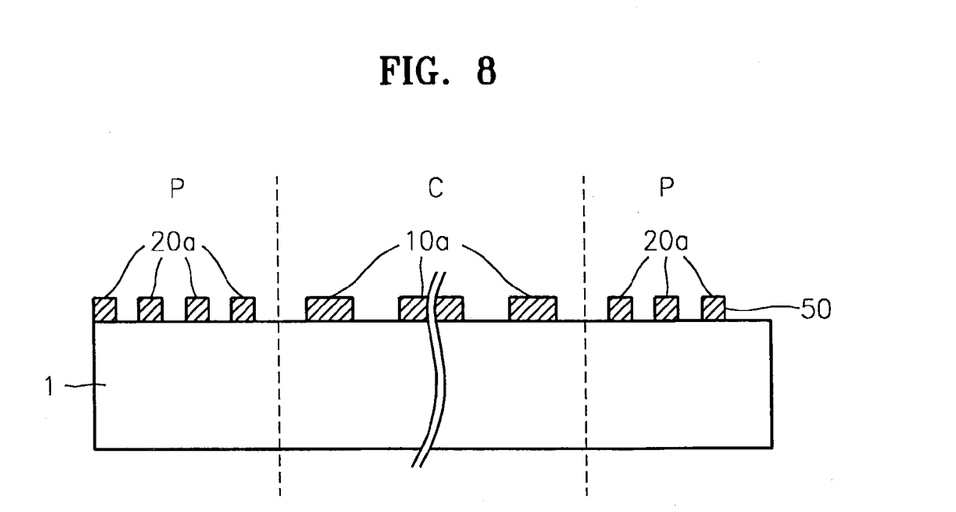

Referring to FIGS. 7 and 8, a main pattern portion 10a and a complementary pattern portion 20a are formed in the Cr layer 50 on the mask substrate 1 using an electron beam lithographer (step S2). More specifically, the Cr layer 50 is irradiated with an e-beam having a predetermined spot diameter to form a main pattern portion 10a of the Cr layer 50. The Cr layer 50 is also scanned with an e-beam to form a complementary pattern portion 20a around the main pattern portion 10a as spaced a predetermined distance therefrom. The complementary pattern portion 20a of the Cr layer 50 consists of a plurality of stripes spaced a predetermined distance from one another.

Figure 9:
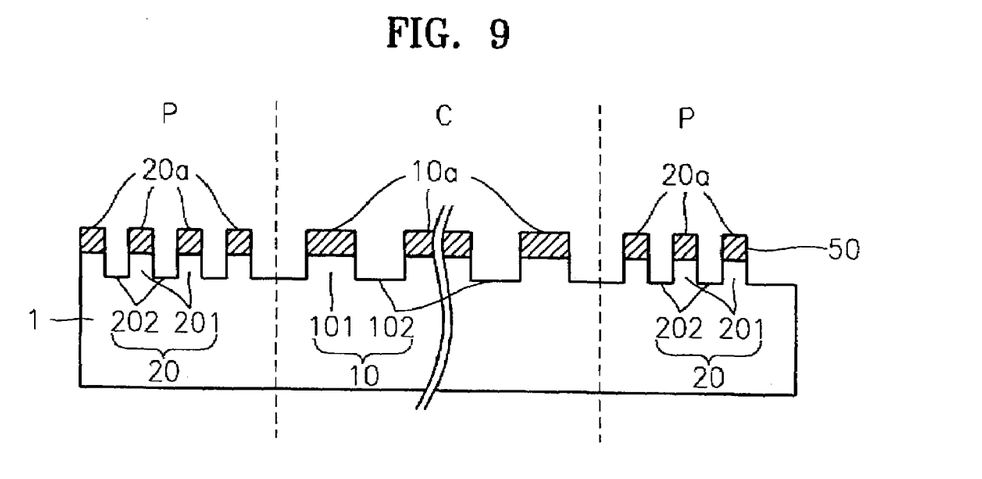

Referring to FIG. 9, the mask substrate 1 is then etched using the main pattern portion 10a and the complementary pattern portion 20a as an etch mask (step S3 in FIG. 5). As a result, the patterns of the main pattern portion 10a and the complementary pattern portion 20a are transferred into the mask substrate 1, i.e., the main pattern group 10 and the complementary pattern portion 20 are formed.

In step S3, the mask substrate 1 is etched using plasma dry etching with a CF-based reactant gas capable of etching silicon oxide layers, which are equivalent to the quartz constituting the mask substrate 1. Plasma dry etching is preferred because, as an anisotropic etching method, it makes it easy to control the etch rate such that a fine, uniform pattern can be formed over the entire surface of the mask substrate 1.

As is clear from the description above, the portions of the mask substrate 1 that are etched away form the main and complementary recessed portions 102 and 202. The surface of the mask substrate 1 is etched to a depth at which a phase difference of 180 degrees can be induced between light passing through the main and complementary recessed portions 102 and 202 and light passing through the main and complementary raised portions 101 and 201. The depth of etching of the mask substrate 1 is controlled by controlling the etching time.

Figure 10:
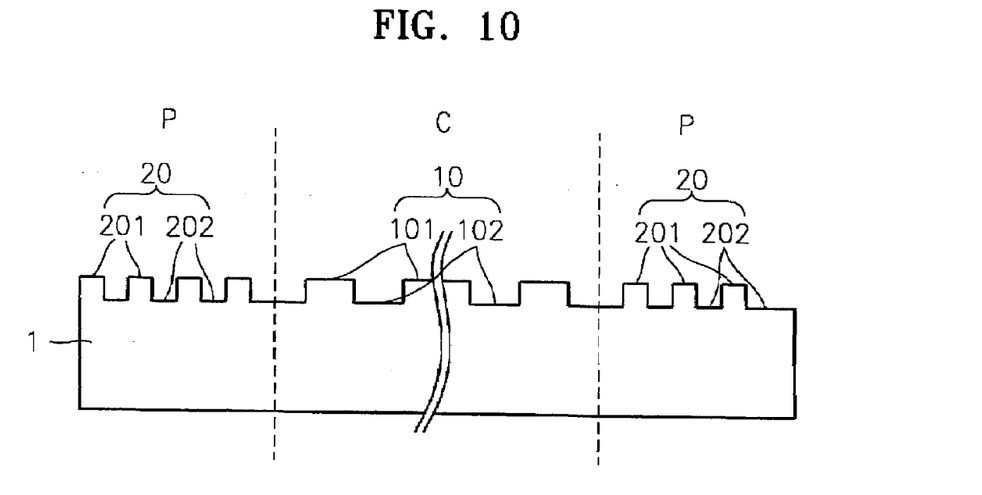

Referring to FIG. 10, the remaining portions of the Cr layer 50, namely the main pattern portion 10a and a complementary pattern portion 20a used as an etch mask, are removed (step S4). Preferably, the Cr layer 50 is removed by wet etching with a metal etchant, and the resulting structure is cleaned to remove any particles produced by the etching process. The metal etchant includes at least one acid solution and thus, it can easily remove the (metal) Cr layer 50. Suitable acid solutions for the metal etchant include solutions of sulfuric acid ($H_2SO_4$), hydrogen chloride (HCl), nitric acid ($HNO_3$), acetic acid ($CH_3COOH$), and mixtures of the forgoing acid solutions. Alternatively, the Cr layer 50 may be removed using a dry back-etching technique.

Figure 11A:
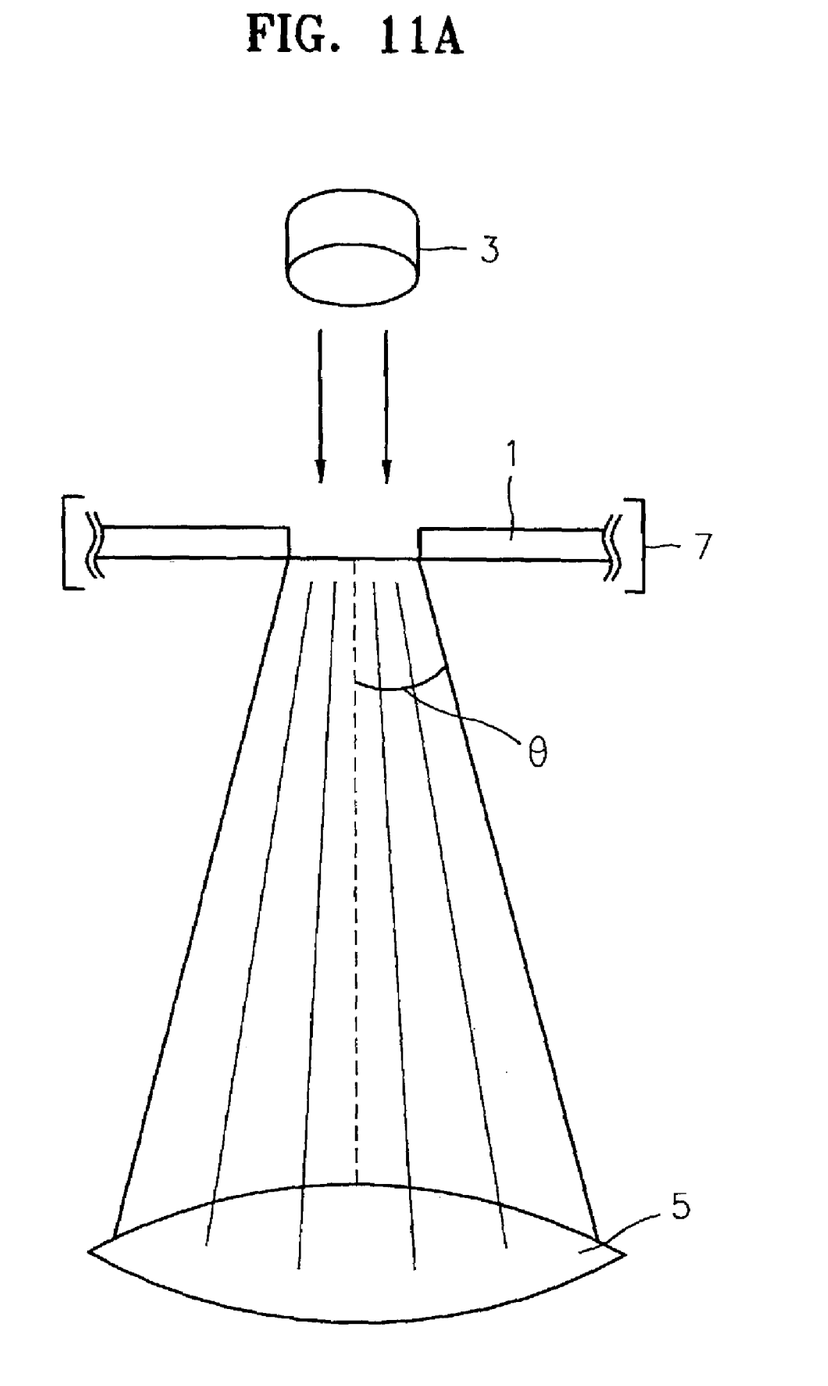
FIG. 11A is a simplified schematic diagram of an alignment and exposure apparatus used in photolithography.

FIG. 11A shows the basic structure of an alignment and exposure apparatus, namely, a stepper, used in photolithography. The stepper includes a light source 3 that emits light of a predetermined wavelength, a mask mount portion 7 equipped with the photomask 1 according to the present invention, and a focusing lens 5 disposed below the mask mount portion 7 and aligned with the light source 3 to focus light emitted from the light source 3 onto a semiconductor substrate (not shown) through the photomask 1. The diffraction angle $\theta$ of light passing through the photomask 1 is established by the wavelength $\lambda$ of light emitted from the light source 3 and the pitch of the complementary raised and recessed portions 201 and 202 of the complementary pattern portion 20 of the photomask 1. For the reasons described earlier, the pitch of the complementary raised and recessed portions 201 and 202 is preferably equal to or smaller than $0.61*(\lambda/\sin \theta)$.

Figure 11B:
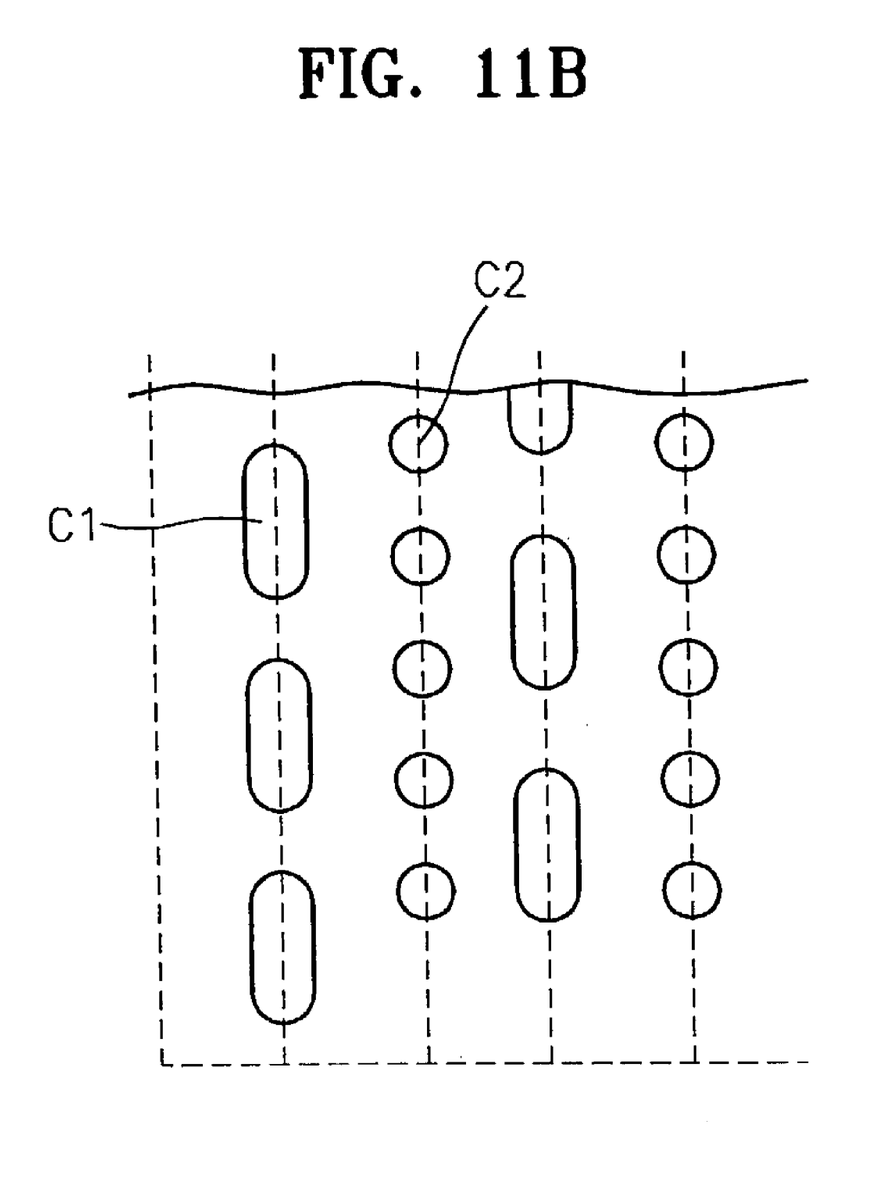
FIG. 11B is a plan view of a contact pattern transferred to a photoresist layer on a semiconductor substrate using the chromeless photomask of FIG. 3 according to the present invention.

FIG. 11B shows the contact pattern transferred to a photoresist layer on a semiconductor substrate using the chromeless photomask of FIG. 3 according to the present invention. Although the chromeless photomask of FIG. 3 has no direct pattern for forming contacts, a photoresist pattern for contacts C1 and C2 is formed by the interference of light rays passing through the raised and recessed pattern portions of the chromeless photomask. Also, the critical dimension of the photoresist patterns formed at locations corresponding to the edge of the main pattern portion 10 (FIG. 3) is maintained uniform due to the interference of the light rays passing through the complementary pattern portion 20 (FIG. 3). That is, the interference of the light rays passing through the complementary raised and recessed portions 201 and 202 of the complementary pattern portion 20 prevents a portion of the photoresist layer from being irradiated such that no pattern is formed in that portion of the photoresist layer. Also, a desired photoresist pattern free from edge distortion can be formed even when there is a slight misalignment in the exposure process. Thus, the chromeless photomask according to the present invention provides an increased alignment margin in the photolithography process. Still further, lens flare at a location corresponding to the edge of the photoresist pattern can be prevented. Therefore, the photolithography process can be performed with a high degree of reliability.

Finally, although the present invention has been particularly shown and described with reference to the preferred embodiments thereof, the present invention is not so limited.

For instance, the complementary pattern portion 20 may be a pattern of dotted lines or spots, instead of a pattern of stripes as described above.

Also, the main and complementary raised portions 101 and 201 and the main and complementary recessed portions 102 and 202 have been described as being formed of the same material. Alternatively, the main and complementary raised portions 101 and 201 can be formed of a different material, but possessing the same light transmittance, as that of the main and complementary recessed portions 102 and 202. As another alternative, the main and complementary raised portions 101 and 201 may be formed of a material, for example, a phase shifting material, possessing a light transmittance different than that of the material constituting the main and complementary recessed portions 102 and 202. In these cases, after a light transmitting material is deposited on a surface of the mask substrate 1 to a predetermined thickness, the main and complementary pattern portions 10 and 20 are formed in the light transmitting material layer using an e-beam lithographer. A fewer number of steps are required for manufacturing such photomasks compared to the case of manufacturing a photomask using a Cr layer according to the present invention. Therefore, such photomasks are more easily manufactured at a lower cost.

Therefore, although the present invention has been particularly shown and described with reference to the preferred embodiments thereof, various changes in form and details may be made thereto without departing from the spirit and scope of the present invention as defined by the following claims.

What is claimed is:

1. A chromeless photomask for use in a photolithographic process of forming a desired pattern on a photoresist layer disposed on a substrate, said chromeless photomask comprising:
    a substrate of a material that will transmit an exposure light of the photolithographic process therethrough and having a core area and a peripheral area adjacent an outer periphery of said core area; and
    a main pattern portion occupying said core area, and a complementary pattern portion occupying said peripheral area,
    said main pattern portion being constituted by a raised portion of material that will transmit the exposure light and a recessed portion of material that will transmit the exposure light,
    the difference in height between the raised and recessed portions of said main pattern portion being such that rays of the exposure light passing through the raised portion will be out of phase by 180 degrees with respect to rays of the exposure light passing through the recessed portion, and
    the raised and recessed portions of said main pattern portion constituting a first pattern dedicated to produce interference, during the photolithographic process, that will form the desired pattern on the photoresist layer,
    said complementary pattern portion being constituted by a raised portion of material that will transmit the exposure light and a recessed portion of material that will transmit the exposure light,
    the difference in height between the raised and recessed portions of said complementary pattern portion being such that rays of the exposure light passing through the raised portion thereof will be out of phase by 180 degrees with respect to rays of the exposure light passing through the recessed portion thereof, and
    the raised and recessed portions of said complementary pattern portion constituting a second pattern that is different from said first pattern, and that will produce interference, during the photolithographic process, that will enhance the portion of the desired pattern formed on the photoresist layer by light passing through an outer edge of the main pattern portion.

2. The chromeless photomask of claim 1, wherein said mask substrate is of quartz.

3. The chromeless photomask of claim 1, wherein said second pattern is a pattern of a series of parallel stripes.

4. The chromeless photomask of claim 3, wherein the complementary pattern portion extends adjacent to and along the outer edge of the main pattern portion as spaced a predetermined distance therefrom, and the raised portion and the recessed portion of the complementary pattern portion comprises a series of alternately arranged recesses and protrusions, the bottom surface of each of the recesses and the upper surface of each of the protrusions having the shape of, and thereby forming, a respective one of said stripes.

5. The chromeless photomask of claim 3, wherein the pitch of the stripes is uniform.

6. An exposure apparatus of photolithographic equipment for use in forming a desired pattern on a photoresist layer on a substrate, said apparatus comprising:
    a light source that emits an exposure light;
    a lens that projects the exposure light onto the photoresist; and
    a chromeless photomask interposed between said light source and said lens said chromeless photomask comprising a substrate of a material that will transmit the exposure light therethrough and having a core area and a peripheral area adjacent an outer periphery of said core area, a main pattern portion occupying said core area, and a complementary pattern portion occupying said peripheral area,
    said main pattern portion being constituted by a raised portion of material that will transmit the exposure light and a recessed portion that will transmit the exposure light,
    the difference in height between the raised and recessed portions of said main pattern portion being such that rays of the exposure light passing through the raised portion will be out of phase by 180 degrees with respect to rays of the exposure light passing through the recessed portion, and
    the raised and recessed portions of said main pattern portion constituting a first pattern dedicated to produce interference, during the photolithographic process, that will form the desired pattern on the photoresist layer,
    said complementary pattern portion being constituted by a raised portion of material that will transmit the exposure light and a recessed portion that will transmit the exposure light,
    the difference in height between the raised and recessed portions of said complementary pattern portion being such that rays of the exposure light passing through the raised portion thereof will be out of phase by 180 degrees with respect to rays of the exposure light passing through the recessed portion thereof, and
    the raised and recessed portions of said complementary pattern portion constituting a second pattern that is different from said first pattern, and that will produce interference, during the photolithographic process, that will enhance the portion of the desired pattern formed on the photoresist layer by light passing through an outer edge of the main pattern portion.

7. The exposure apparatus of claim 6, wherein said second pattern constituted by the raised and recessed portions of said complementary pattern portion of the chromeless photomask is a pattern of parallel stripes.

8. The exposure apparatus of claim 7, wherein the pitch of the stripes is uniform.

9. The exposure apparatus of claim 8, wherein said pitch is no greater than $0.61*(\lambda/\sin\theta)$, wherein $\lambda$ is the wavelength of the exposure light, and $\theta$ is the angle of diffraction of the exposure light through said substrate.

* * * * *